(12) United States Patent
Hao et al.

(10) Patent No.: US 10,262,887 B2
(45) Date of Patent: Apr. 16, 2019

(54) PIN LIFTER ASSEMBLY WITH SMALL GAP

(71) Applicant: Lam Research Corporation, Fremont, CA (US)

(72) Inventors: Fangli Hao, Cupertino, CA (US); Yuehong Fu, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 274 days.

(21) Appl. No.: 15/298,590

(22) Filed: Oct. 20, 2016

(65) Prior Publication Data

US 2018/0114716 A1 Apr. 26, 2018

(51) Int. Cl.
*H01L 21/687* (2006.01)

(52) U.S. Cl.
CPC .. *H01L 21/68742* (2013.01); *H01L 21/68785* (2013.01)

(58) Field of Classification Search
CPC ................................ B23Q 7/005; H01L 21/68
See application file for complete search history.

(56) References Cited

U.S. PATENT DOCUMENTS

| | | | | |
|---|---|---|---|---|
| 5,677,824 A * | 10/1997 | Harashima | .......... | H01L 21/6831 118/723 R |
| 5,848,670 A * | 12/1998 | Salzman | .................... | B66F 7/00 187/272 |
| 5,879,128 A * | 3/1999 | Tietz | ................. | H01L 21/68742 414/757 |
| 6,148,762 A * | 11/2000 | Fukuda | ............... | C23C 16/4581 118/715 |
| 6,435,798 B1 * | 8/2002 | Satoh | .................. | C23C 16/4586 118/728 |
| 6,898,064 B1 * | 5/2005 | Berman | ............. | H01L 21/6831 361/233 |
| 7,292,428 B2 * | 11/2007 | Hanawa | ............. | H01L 21/6831 361/234 |
| 7,311,784 B2 * | 12/2007 | Fink | ................... | H01J 37/32642 118/723 E |
| 7,750,818 B2 * | 7/2010 | Lee | .................. | H01L 21/67259 340/686.1 |
| 8,033,245 B2 * | 10/2011 | Kurita | ................. | B65G 49/061 118/723 E |
| 8,256,754 B2 * | 9/2012 | Lerner | ............. | H01L 21/68742 269/54 |

(Continued)

FOREIGN PATENT DOCUMENTS

WO 2011009007 A2 1/2011

OTHER PUBLICATIONS

Notification of Transmittal of International Search Report and Written Opinion dated Jan. 31, 2018 corresponding to PCT/US2017/057355, 13 pages.

*Primary Examiner* — Tyrone V Hall, Jr.

(57) ABSTRACT

A pin lifter assembly for a substrate support in a substrate processing system includes a lift pin having a shaft, an upper end, and a lower end, and an insert arranged around the lift pin. The insert defines a gap between the insert and the lift pin. A clamp assembly is arranged around the lower end of the lift pin. The lower end of the lift pin is secured within the clamp assembly such that the clamp assembly prevents vertical movement of the lift pin relative to the clamp assembly. The clamp assembly is configured to allow horizontal movement of the lower end of the lift pin within the clamp assembly.

20 Claims, 5 Drawing Sheets

(56) References Cited

U.S. PATENT DOCUMENTS

| | | | |
|---|---|---|---|
| 9,011,602 B2 | 4/2015 | Hao | |
| 2002/0011204 A1* | 1/2002 | Gujer | C23C 16/405 |
| | | | 118/500 |
| 2003/0026646 A1* | 2/2003 | Mochizuki | F16C 29/04 |
| | | | 403/231 |
| 2003/0205329 A1* | 11/2003 | Gujer | C23C 16/405 |
| | | | 156/345.51 |
| 2004/0041322 A1* | 3/2004 | Bode | B25B 5/062 |
| | | | 269/24 |
| 2004/0045509 A1* | 3/2004 | Or | C23C 16/4401 |
| | | | 118/729 |
| 2006/0156981 A1* | 7/2006 | Fondurulia | C23C 16/4408 |
| | | | 118/715 |
| 2010/0032096 A1* | 2/2010 | Yu | H01L 21/67103 |
| | | | 156/345.52 |
| 2014/0041579 A1* | 2/2014 | Jeong | B05C 13/00 |
| | | | 118/500 |
| 2014/0265090 A1 | 9/2014 | Hou | |
| 2014/0265097 A1 | 9/2014 | Cuvalci et al. | |

* cited by examiner

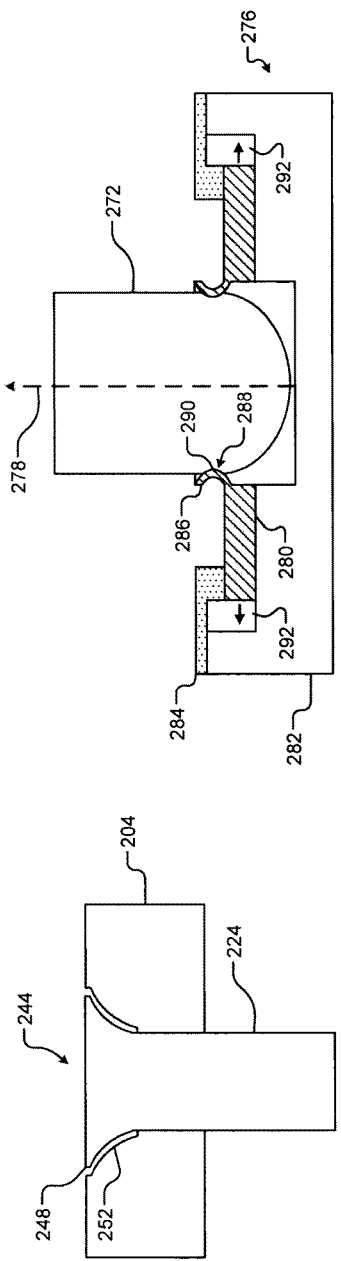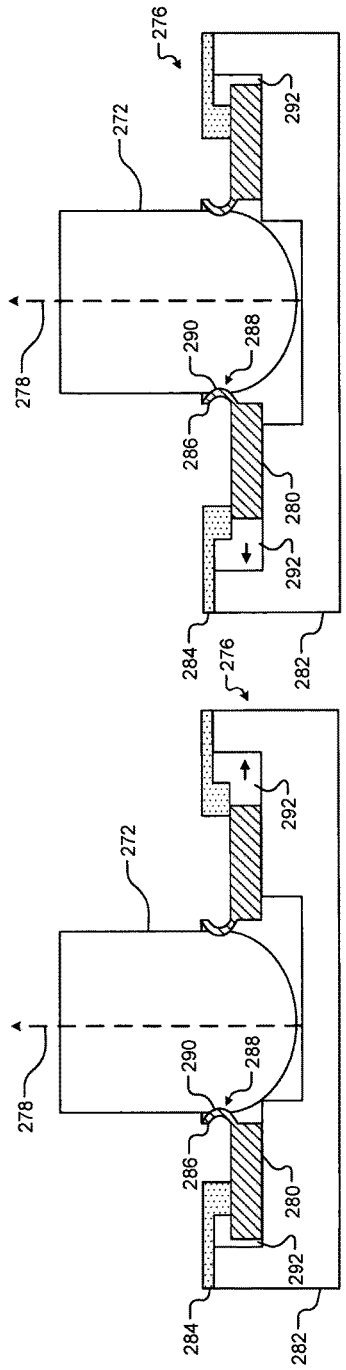

PIN LIFTER ASSEMBLY WITH SMALL GAP

FIELD

The present disclosure relates to substrate processing systems, and more particularly to pin lifter assemblies for substrate supports.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a substrate. For example, the substrate may be clamped to the ceramic layer during processing. The substrate support may include a plurality of pin lifter assemblies arranged to lift or raise the substrate relative to the ceramic layer for retrieval, and/or to lower the substrate onto the ceramic layer. For example, each pin lifter assembly includes a pin (which may also be referred to as a "lift pin," "pin lifter," "lifter pin," etc.). The substrate support includes one or more actuators configured to selectively raise and lower the pins.

SUMMARY

A pin lifter assembly for a substrate support in a substrate processing system includes a lift pin having a shaft, an upper end, and a lower end, and an insert arranged around the lift pin. The insert defines a gap between the insert and the lift pin. A clamp assembly is arranged around the lower end of the lift pin. The lower end of the lift pin is secured within the clamp assembly such that the clamp assembly prevents vertical movement of the lift pin relative to the clamp assembly. The clamp assembly is configured to allow horizontal movement of the lower end of the lift pin within the clamp assembly.

A substrate support for a substrate processing system includes a baseplate including plurality of channels, a ceramic layer arranged on the baseplate, the ceramic layer including a plurality of lift pin holes corresponding to the plurality of channels, and a plurality of pin lifter assemblies arranged in the plurality of channels, each of the pin lifter assemblies including a lift pin having a shaft, an upper end, and a lower end, and a clamp assembly arranged around the lower end of the lift pin, wherein (i) the lower end of the lift pin is secured within the clamp assembly such that the clamp assembly prevents vertical movement of the lift pin relative to the clamp assembly and (ii) the clamp assembly is configured to allow horizontal movement of the lower end of the lift pin within the clamp assembly.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2B is an example upper end of a lift pin according to the present disclosure;

FIGS. 2C, 2D, and 2E illustrate an example clamp assembly according to the present disclosure;

In the drawings, reference numbers may be reused to identify similar and/or identical elements.

DETAILED DESCRIPTION

A substrate support in a substrate processing system may include a plurality of pin lifter assemblies configured to raise and lower a substrate. Manufacturing tolerances associated with components of the pin lifter assemblies may result in respective gaps between the components and various components of the substrate support. For example, gaps may be present between lift pins and a ceramic layer, a baseplate, etc. of the substrate support. Larger gaps allow increased exposure of some components to plasma and other process gases. For example, a bond layer between the baseplate and the ceramic layer may be exposed to plasma, causing erosion of the bond layer. Further, arcing is more likely to occur in the larger gaps. Accordingly, potential effects such as erosion and arcing may limit power applied to the substrate support, cause increased down time for maintenance, etc.

Systems and methods according to the principles of the present disclosure implement one or more features that reduce gaps between components of pin lifter assemblies and adjacent structures of a substrate support.

Figure 1:
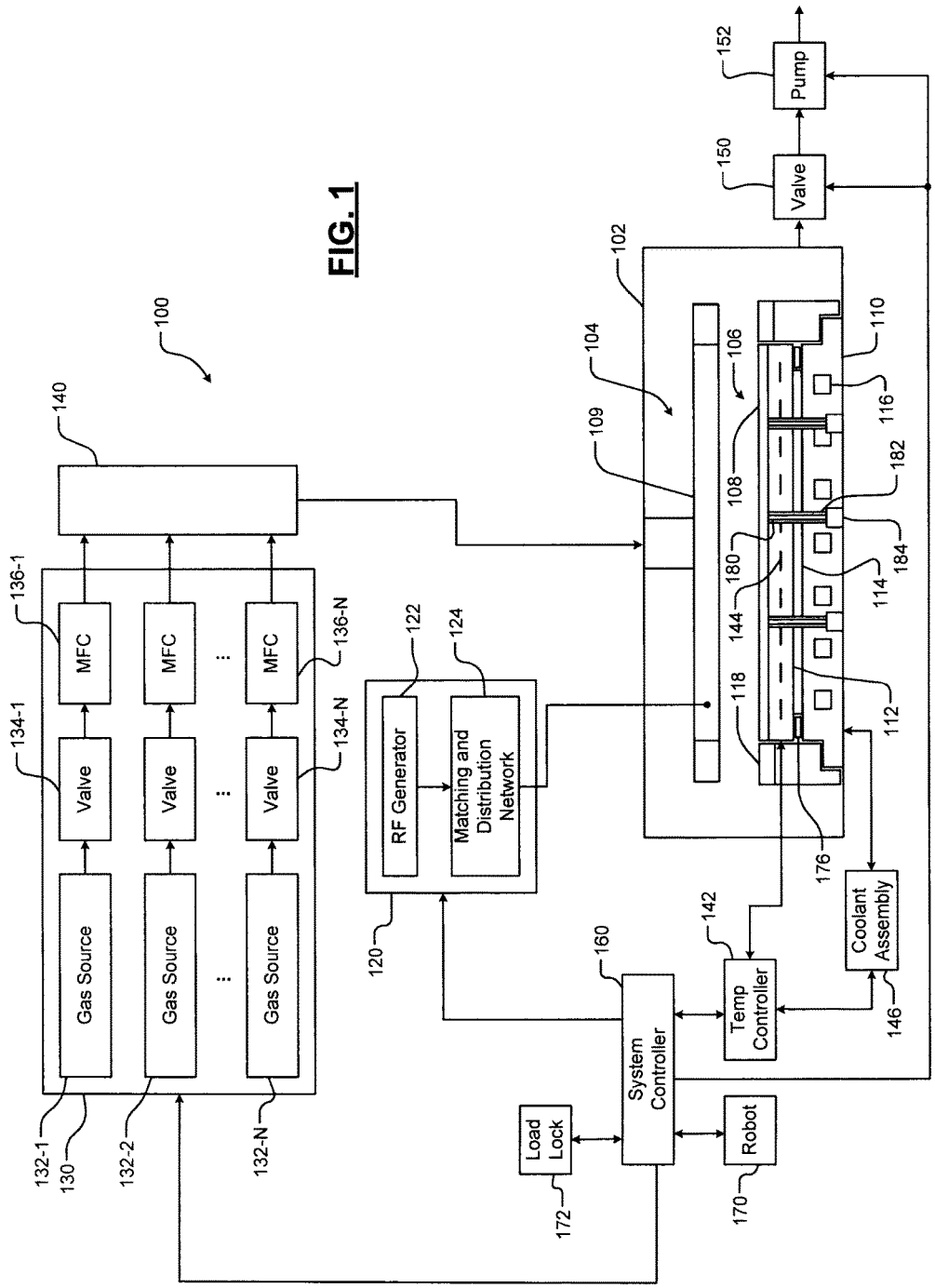
FIG. 1 is a functional block diagram of an example processing chamber according to the present disclosure.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, ..., and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, ..., and 134-N (collectively valves 134) and mass flow controllers 136-1, 136-2, ..., and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Each of the heating elements 144 according to the principles of the present disclosure includes a first material having a positive TCR and a second material having a negative TCR as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes a plurality of lift pins 180 arranged within respective lift pin holes or channels 182. Respective actuators 184 are configured to selectively raise and lower the lift pins 180 to raise and lower the substrate 108 arranged on the substrate support 106. The lift pins 180 and/or the lift pin channels 182 implement one or more features according to the principles of the present disclosure as described below in more detail.

Referring now to FIGS. 2A, 2B, 2C, 2D, and 2E, a portion of an example substrate support 200 according to the principles of the present disclosure is shown. The substrate support 200 includes a ceramic layer 204 arranged on a baseplate 208. A bond layer 212 is provided between the ceramic layer 204 and the baseplate 208. The ceramic layer 204 supports a substrate 216 during processing.

The substrate support 200 includes a plurality of pin lifter assemblies 218 provided within respective holes or channels (shown in FIG. 2A as only a single channel 220) arranged through the ceramic layer 204, the baseplate 208, and the bond layer 212. A lift pin 224 is arranged within the channel 220. An actuator 228 in mechanical communication with the lift pin 224 is configured to selectively raise and lower the lift pin 224 to raise and lower the substrate 216. As shown for example only, the actuator 228 corresponds to a linear actuator arranged at a lower end of the lift pin 224, although other suitable actuators and arrangements may be used.

The pin lifter assembly 218 may include an insert such as a ceramic insert 232 provided at an upper end of the channel 220. Dimensions of the channel 220 and/or the ceramic insert 232 are selected to provide a predetermined minimum gap 236 between the lift pin 224 and an inner surface of the ceramic insert 232. In this manner, the gap 236 ensures that movement (i.e., raising and lowering) of the lift pin 224 within the channel 220 is not impeded. For example, the gap 236 may be determined according to manufacturing tolerances (e.g., variations in diameter and/or surface contour, slight bending, etc.) associated with the manufacture of the lift pin 224. Conversely, the gap 236 increases the likelihood of arcing and increases erosion of the bond layer 212 due to exposure to plasma. Various features of the channel 220 and the lift pin 224 as described below reduce a width of the gap 236 to prevent arcing and erosion while still allowing proper movement of the lift pin 224 within the channel 220.

In one example, an upper end (e.g., top) 244 of the lift pin 224 is flared or filleted. In other words, the upper end 244 has a greater diameter relative to a diameter of a shaft 246 of the lift pin 224 within the channel 220. Accordingly, a transition 248 between the lift pin 224 and the upper end 244 is filleted. The filleted transition 248 may conform to a chamfered opening 252 of the ceramic layer 204. As used herein, the upper end 224 of the lift pin 224 having the transition 248 may be referred to as a pin cap or pin hat. The upper end 224 of the lift pin 224 prevents process materials (e.g., plasma) from entering the opening 252 of the ceramic layer 204 to reduce arcing in the gap 236, reduce erosion of the bond layer 212, etc.

In another example, the ceramic insert 232 includes a flange portion 256 arranged to extend above the baseplate 208 and into the ceramic layer 204. For example a bottom surface 260 of the ceramic layer 204 may include a groove or slot 264 arranged to receive the flange portion 256. The flange portion 256 is positioned between the gap 236 and the bond layer 212. Accordingly, the flange portion 256 of the ceramic insert 232 functions as a barrier between process gases (e.g., plasma) within the gap 236 and the bond layer 212. In this manner, the flange portion 256 reduces exposure to and erosion caused by process gases in the gap 236. In some examples, the flange portion 256 may be glued or otherwise sealed to the ceramic layer 204.

The pin lifter assembly 218 may include a pin bearing 268 provided in the gap 236 between the lift pin 224 and the ceramic insert 232. For example only, the pin bearing 268 may comprise Teflon (e.g., anodized or impregnated/doped Teflon) or other suitable polymer material. The pin bearing 268 further reduces the gap 236 to prevent arcing and exposure of components to process gases.

A lower end 272 of the lift pin 224 may be moveably secured within a clamp assembly 276. The actuator 228 may be configured to raise and lower the clamp assembly 276. The clamp assembly 276 secures the lower end 272 of the lift pin 224 to prevent vertical movement (i.e., movement along a path substantially parallel to a longitudinal axis 278) of the lift pin 224 relative to the clamp assembly 276. Accordingly, raising and lowering the clamp assembly 276 correspondingly raises and lowers the lift pin 224. However, the clamp assembly 276 allows movement of the lower end 272 of the lift pin 224 in a horizontal direction relative to the clamp assembly 276 (i.e., in a direction substantially perpendicular to the longitudinal axis 278 of the lift pin 224).

In one example, the clamp assembly 276 includes a middle portion 280 moveably secured between a base portion 282 and an upper portion 284. The middle portion 284 includes a clamp ring 286 arranged to encircle the lower end 272 of the lift pin 224. For example, the lower end 272 of the lift pin 224 may include a groove or slot 288. An inner radius 290 of the clamp ring 286 may have a rounded, curved, etc. profile that extends into the slot 288 to capture the lower end 272 of the lift pin 224. The clamp ring 286 may be flexible relative to the middle portion 284. For example, the clamp ring 286 may be configured to flex radially inward and/or outward relative to the middle portion 284, and may be biased toward the slot 288 to secure the lower end 272 of the lift pin 224.

Although the middle portion 280 is secured between the base portion 282 and the upper portion 284 (e.g., secured to prevent vertical movement of the middle portion 280 relative to the base portion 282 and the upper portion 284), the clamp assembly 276 is configured to allow horizontal/lateral (e.g., side to side) movement of the middle portion 280. For example, the clamp assembly 276 may include a gap 292 around an outer perimeter of the middle portion 280. In one example, the gap 292 is defined between the base portion 282, the outer perimeter of the middle portion 280, and the upper portion 284. Further, the middle portion 280 is not fixedly attached (e.g., glued or otherwise adhered) to the base portion 282 and the upper portion 284. Accordingly, the middle portion 280, as well as the lower end 272 of the lift pin 224, is configured to slide or shift to the left (e.g., as shown in FIG. 2D) or the right (e.g., as shown in FIG. 2E) of the clamp assembly 276 as the clamp assembly 276 and the lift pin 224 are raised and lowered.

In this manner, a width of the gap 236 between the lift pin 224 and the ceramic insert 232 may be reduced (e.g., by providing the pin bearing 268) without interfering with the vertical movement of the lift pin 224. For example, as described above, the gap 236 is typically configured to accommodate manufacturing tolerances associated with the lift pin 224. Accordingly, the lift pin 224 may include undesirable characteristics such as slight bending. When the lower end 272 of the lift pin 224 is fixedly attached to another structure (e.g., the actuator 228), the gap 236 allows lateral movement of the lift pin 224 to accommodate any bending or other non-uniformities of the lift pin 224. Conversely, the clamp assembly 276 as described herein allows lateral movement of the lower end 272 during raising and lowering of the lift pin 224 to compensate for any non-uniformities such as bending of the lift pin 224.

Figure 3:
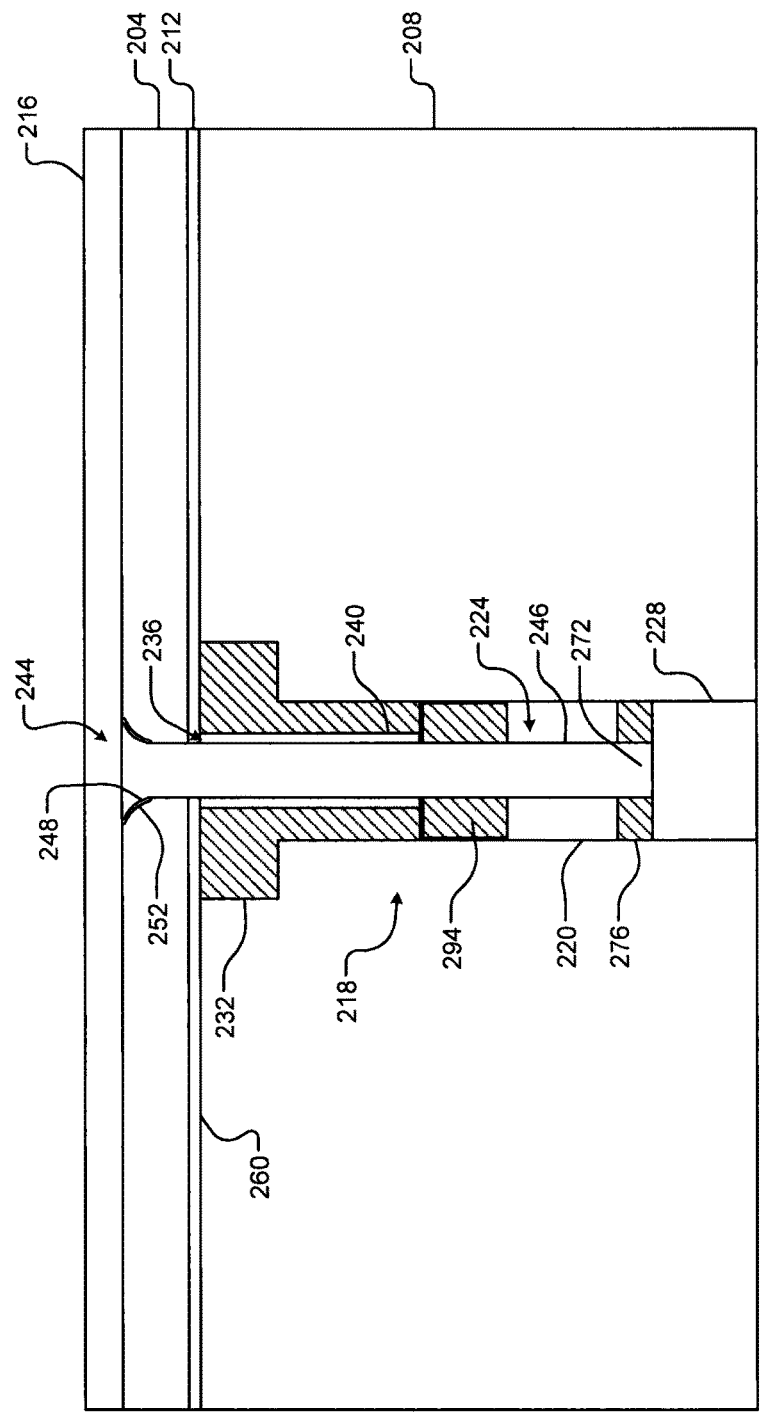
FIG. 3 is a second example pin lifter assembly according to the present disclosure.

Referring now to FIG. 3, in another example, the pin lifter assembly 218 may include a pin bearing 294 located below the ceramic insert 232. In this example, the pin bearing 268 may be omitted. In other examples, the pin lifter assembly 218 may include both the pin bearing 268 and the pin bearing 294.

Figure 2A:
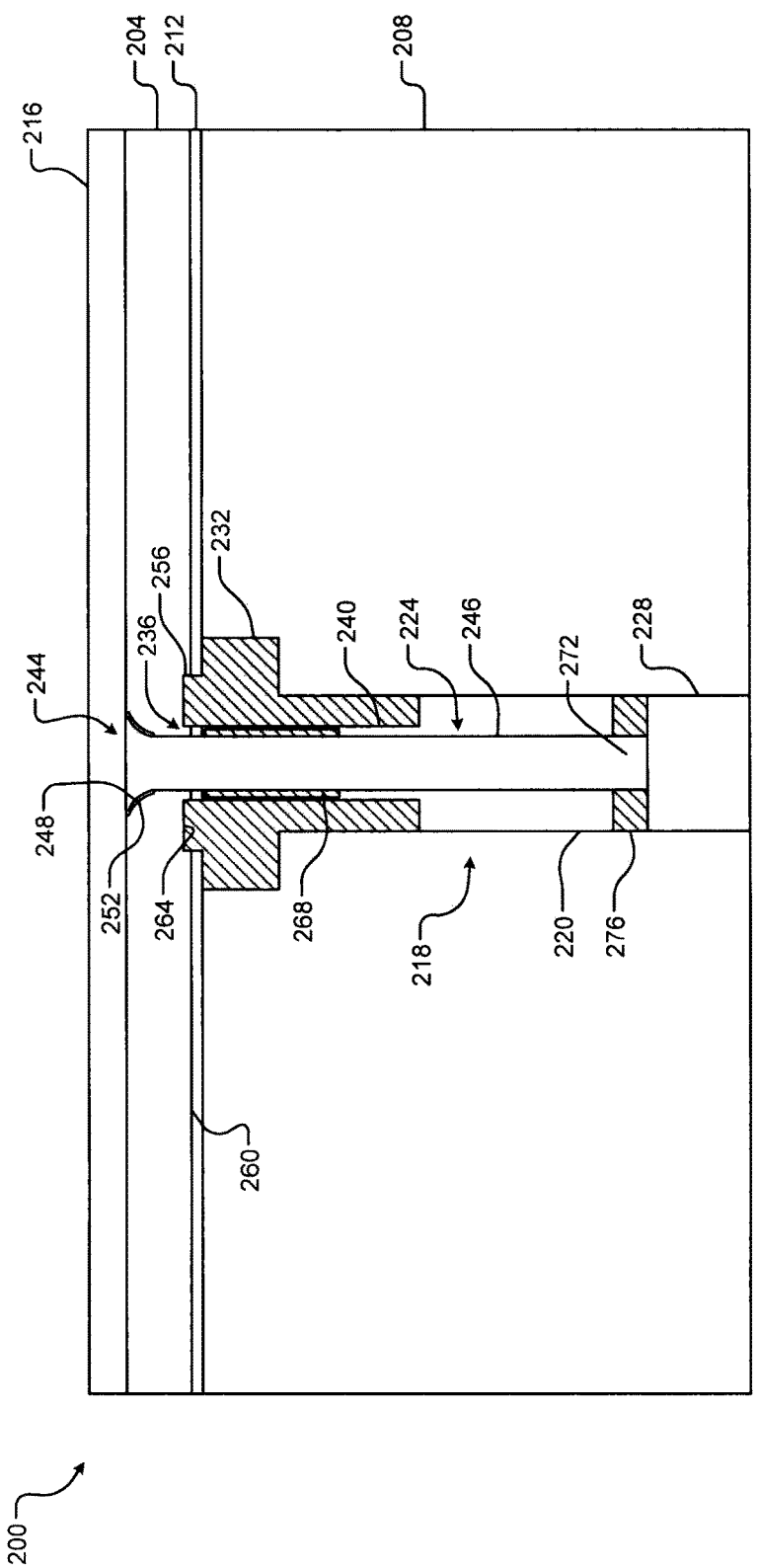
FIG. 2A is a first example pin lifter assembly according to the present disclosure.
Figure 4:
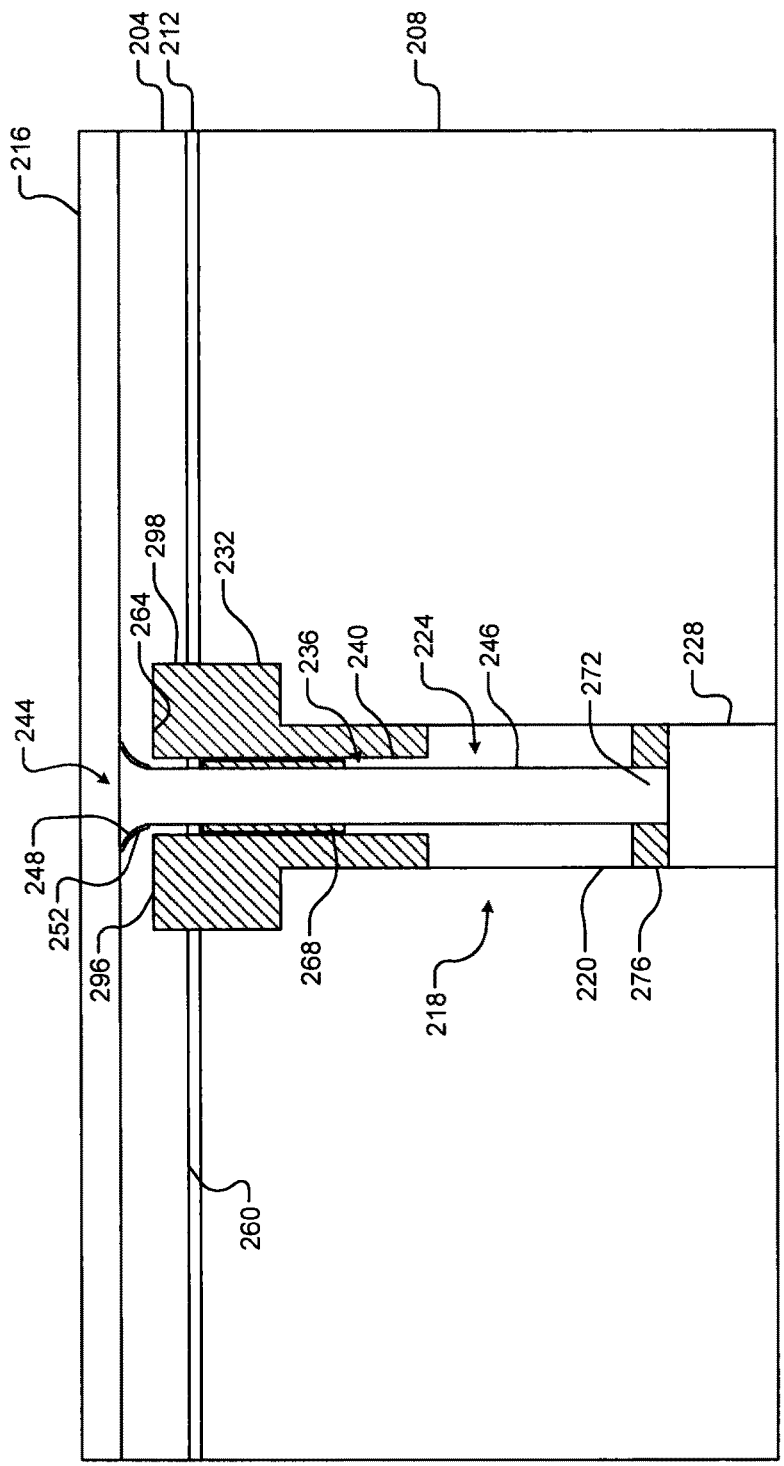
FIG. 4 is a third example pin lifter assembly according to the present disclosure.

Referring now to FIG. 4, in another example, the ceramic insert 232 extends into the ceramic layer 204. In other words, instead of including the flange portion 256 as shown in FIG. 2A, an entire upper portion 296 of the ceramic insert 232 extends into the ceramic layer 204. In one example, an outer radius 298 of the upper portion 296 and the opening 264 of the ceramic layer 204 are threaded. The upper portion 296 may also be bonded or glued within the opening 264.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A pin lifter assembly for a substrate support in a substrate processing system, the pin lifter assembly comprising:
    a lift pin having a shaft, an upper end, and a lower end;
    an insert arranged around the lift pin, wherein the insert defines a first gap between the insert and the lift pin; and
    a clamp assembly arranged around the lower end of the lift pin, wherein (i) the lower end of the lift pin is secured within the clamp assembly such that the clamp assembly prevents vertical movement of the lift pin relative to the clamp assembly and (ii) the clamp assembly is configured to allow horizontal movement of the lower end of the lift pin within the clamp assembly,
    wherein the clamp assembly includes (i) a base portion and (ii) a middle portion including a clamp ring encircling the lower end of the lift pin to retain the lower end of the lift pin within the clamp assembly, and
    wherein a second gap is defined between the base portion and the middle portion around the lower end of the lift pin, and wherein, to allow the horizontal movement of the lower end of the lift pin within the clamp assembly, the clamp assembly is configured to allow movement of the middle portion into the second gap.

2. The pin lifter assembly of claim 1, wherein a transition from the shaft of the lift pin to the upper end of the lift pin is filleted such that a diameter of the upper end is greater than a diameter of the shaft.

3. The pin lifter assembly of claim 1, further comprising a bearing arranged around the lift pin.

4. The pin lifter assembly of claim 3, wherein the bearing is arranged in the first gap between the insert and the lift pin.

5. The pin lifter assembly of claim 3, wherein the bearing is arranged below the insert between the insert and the lower end of the lift pin.

6. The pin lifter assembly of claim 1, wherein the insert includes a flange portion that protrudes from an upper end of the insert.

7. The pin lifter assembly of claim 1, wherein the clamp assembly further comprises:
an upper portion,
wherein the middle portion is secured between the base portion and the upper portion.

8. The pin lifter assembly of claim 7, wherein (i) the lower end of the lift pin includes a slot and (ii) an inner radius of the clamp ring extends into the slot to retain the lower end of the lift pin within the clamp assembly.

9. The pin lifter assembly of claim 8, wherein the clamp ring is biased inward toward the slot of the lift pin.

10. The pin lifter assembly of claim 7, wherein the second gap is defined between the base portion, the upper portion, and the middle portion.

11. The pin lifter assembly of claim 10, wherein the second gap is defined around an outer perimeter of the middle portion.

12. The pin lifter assembly of claim 11, wherein, to allow the horizontal movement of the lower end of the lift pin within the clamp assembly, the middle portion is configured to slide between the base portion and the upper portion into the second gap.

13. A substrate support for a substrate processing system, the substrate support comprising:
a baseplate including plurality of channels;
a ceramic layer arranged on the baseplate, the ceramic layer including a plurality of lift pin holes corresponding to the plurality of channels; and
a plurality of pin lifter assemblies arranged in the plurality of channels, each of the pin lifter assemblies including
a lift pin having a shaft, an upper end, and a lower end, and
a clamp assembly arranged around the lower end of the lift pin, wherein (i) the lower end of the lift pin is secured within the clamp assembly such that the clamp assembly prevents vertical movement of the lift pin relative to the clamp assembly and (ii) the clamp assembly is configured to allow horizontal movement of the lower end of the lift pin within the clamp assembly,
wherein the clamp assembly includes (i) a base portion and (ii) a middle portion including a clamp ring encircling the lower end of the lift pin to retain the lower end of the lift pin within the clamp assembly, and
wherein a first gap is defined between the base portion and the middle portion around the lower end of the lift pin, and wherein, to allow the horizontal movement of the lower end of the lift pin within the clamp assembly, the clamp assembly is configured to allow movement of the middle portion into the first gap.

14. The substrate support of claim 13, wherein each of the pin lifter assemblies further comprises an insert arranged around the lift pin, wherein the insert defines a second gap between the insert and the lift pin.

15. The substrate support of claim 14, wherein each of the pin lifter assemblies further comprises a bearing arranged around the lift pin, wherein the bearing is arranged at least one of (i) in the second gap between the insert and the lift pin and (ii) below the insert between the insert and the lower end of the lift pin.

16. The substrate support of claim 14, wherein the insert includes a flange portion that protrudes from an upper end of the insert.

17. The substrate support of claim 13, wherein the clamp assembly further comprises:
an upper portion,
wherein the middle portion is secured between the base portion and the upper portion.

18. The substrate support of claim 17, wherein (i) the lower end of the lift pin includes a slot and (ii) an inner radius of the clamp ring extends into the slot to retain the lower end of the lift pin within the clamp assembly.

19. The substrate support of claim 17, wherein the first gap is defined between the base portion, the upper portion, and the middle portion.

20. The substrate support of claim 19, wherein the first gap is defined around an outer perimeter of the middle portion.

* * * * *